United States Patent [19]

Sarin

[11] Patent Number: 5,035,923
[45] Date of Patent: Jul. 30, 1991

[54] PROCESS FOR THE DEPOSITION OF HIGH TEMPERATURE STRESS AND OXIDATION RESISTANT COATINGS ON SILICON-BASED SUBSTRATES

[75] Inventor: Vinod K. Sarin, Lexington, Mass.

[73] Assignee: GTE Laboratories Incorporated, Waltham, Mass.

[21] Appl. No.: 526,365

[22] Filed: May 21, 1990

Related U.S. Application Data

[60] Division of Ser. No. 250,980, Sep. 23, 1988, Pat. No. 4,950,558, which is a continuation of Ser. No. 103,332, Oct. 1, 1987, abandoned.

[51] Int. Cl.$^5$ .......................... C23C 16/00; B05D 1/36
[52] U.S. Cl. .................................. 427/255; 427/255.1; 427/255.2; 427/255.3; 427/126.3; 427/126.2; 427/419.2
[58] Field of Search ................... 427/255, 255.1, 255.2, 427/255.3, 248.1, 126.3, 126.4, 419.2, 419.1, 419.3, 126.1, 126.2; 428/698, 689, 699, 701

[56] References Cited

U.S. PATENT DOCUMENTS

| | | | |
|---|---|---|---|
| 4,312,899 | 1/1982 | Lahmann | 427/180 |
| 4,449,989 | 5/1984 | Sarin et al. | 51/295 |
| 4,619,866 | 10/1986 | Smith et al. | 428/336 |
| 4,702,970 | 10/1987 | Sarin et al. | 428/688 |
| 4,756,976 | 7/1988 | Komeya et al. | 428/698 |

Primary Examiner—Michael Lusignan
Assistant Examiner—Roy V. King
Attorney, Agent, or Firm—Frances P. Craig

[57] ABSTRACT

A process for depositing a high temperature stress and oxidation resistant coating on a silicon nitride- or silicon carbide-based substrate body. A gas mixture is passed over the substrate at about 900°–1500° C. and about 1 torr to about ambient pressure. The gas mixture includes one or more halide vapors with other suitable reactant gases. The partial pressure ratios, flow rates, and process times are sufficient to deposit a continuous, fully dense, adherent coating. The halide and other reactant gases are gradually varied during deposition so that the coating is a graded coating of at least two layers. Each layer is a graded layer changing in composition from the material over which it is deposited to the material of the layer and further to the material, if any, deposited thereon, so that no clearly defined compositional interfaces exist. The gases and their partial pressures are varied according to a predetermined time schedule and the halide and other reactant gases are selected so that the layers include (a) an adherent, continuous intermediate layer about 0.5–20 microns thick of an aluminum nitride or an aluminum oxynitride material, over and chemically bonded to the substrate body, and (b) an adherent, continuous first outer layer about 0.5–900 microns thick including an oxide of aluminum or zirconium over and chemically bonded to the intermediate layer.

10 Claims, No Drawings

PROCESS FOR THE DEPOSITION OF HIGH TEMPERATURE STRESS AND OXIDATION RESISTANT COATINGS ON SILICON-BASED SUBSTRATES

The Government of the United States of America has rights in this invention pursuant to Subcontract No. 86X-95915C of Contract No. DE AC05-84OR21400, awarded by or for the U.S. Department of Energy.

This application is a division of application Ser. No. 250,980, now U.S. Pat. No. 4,950,558, filed Sept. 23, 1988, which is a continuation of application Ser. No. 103,332, now abandoned, filed Oct. 1, 1987.

REFERENCE TO RELATED APPLICATIONS

This application is related to commonly owned U.S. Pat. Nos. 4,745,010 and 4,751,109, both incorporated herein by reference, and to commonly owned U.S. Pat. No. 4,892,792, a continuation of U.S. patent application Ser. No. 07/103,333, filed Oct. 1, 1987 by V. K. Sarin and now abandoned.

THE FIELD OF THE INVENTION

This invention relates to an article comprising a graded coating deposited on hard silicon-based ceramic substrates, and more particularly to a coated article having oxidation resistance and high temperature strength. The coating comprises at least two graded layers on such a substrate. The invention also relates to a process for producing the article.

BACKGROUND OF THE INVENTION

Hard silicon-based ceramic materials are known and are used extensively in such applications as metal cutting and boring tools, metal drawing dies, wear-resistant machine parts and the like. Such silicon-based materials include monolithic and composite silicon nitride and silicon carbide materials. The service properties such as wear, high temperature and chemical resistance of such materials may be enhanced by the application of one or more thin coatings of, for example, metal carbides, metal nitrides, or ceramics Cutting tools of coated silicon nitride-based materials are disclosed in U.S. Pat. Nos. 4,416,670 and 4,431,431 (metal carbide coatings), 4,406,667 and 4,406,668 (metal nitride coatings), 4,409,003 and 4,409,004 (metal carbonitride coatings), 4,421,525 and 4,440,547 (alumina coatings), and 4,441,894 and 4,449,989 (metal carbide, nitride or carbonitride undercoatings with alumina outer coatings). Great strides have been made in improved performance of these coated substrates, for example in machining applications, by refinement of the substrate compositions and by applying various combinations of superimposed layers of coating materials.

Such high technology ceramic materials offer the potential for good performance characteristics for high temperature applications due to their mechanical strength and fracture toughness. However as components for advanced gas turbine engines, they have not demonstrated satisfactory resistance to contact stress, including sliding contact stress, and to high temperature oxidation under contact stress conditions. Oxide coatings are known to provide oxidation resistance to various materials at high temperatures. However contact stress damage at ceramic-ceramic interfaces is still a major failure mode for ceramic heat engine components. Researchers have found that oxide coatings about 50–100 microns thick of the alumina or zirconia type provide improved protection against such surface damage and loss of strength under sliding contact. Such coatings however have not shown adequate adherence under long term use in heat engine applications. Thermal barrier coatings applied by physical vapor deposition methods have been developed for diesel engine components. The coating has a bond coat about 100–200 microns thick of a metal-chromium-aluminum-yttrium composition, the metal being Fe, Co, or Ni. A protective yttria stabilized zirconia coating about 800 microns thick is applied over the bond coat. These coatings, however, for the most part are inherently porous unless applied by Electron Beam Evaporation methods.

Severe thermal cycling conditions are encountered by the components used in heat engines, where cycling between ambient temperatures and temperatures that can reach as high as 1400° C. is repeatedly encountered over long periods of use. Differences in the thermal expansion coefficients of the materials of the substrate and the coating and, in multilayer coatings, of the materials of the various layers of the coating can lead to high tensile and compressive stresses in the coating. These stresses are also dependent on the thickness of the coating. Severe stresses can lead to thermal shock and to cracking and debonding of the coating under such severe conditions of use.

Further, severe localized surface stress can occur in such components due to the brittleness and hardness of the silicon based materials and the oxide coatings. The severity of the stress is largely due to the fact that the hardness of the materials prevents redistribution of the localized stress. If the localized stress exceeds the baseline strength of the material, the surface of the component will be damaged, and the strength and oxidation resistance of the component will be reduced.

The invention described herein and recited in the appended claims provides an article in which a ceramic coating of controlled graded composition and distribution is deposited on a hard silicon-based ceramic substrate, the article showing long term adherence and contact stress resistance in oxidizing environments and/or high temperature thermal cycling conditions, such as those described above.

SUMMARY OF THE INVENTION

A coated article according to one aspect of the invention includes a fully dense shaped substrate body of a silicon nitride- or silicon carbide-based monolithic or composite material. An adherent, continuous, fully dense intermediate layer about 0.5–20 microns thick of an aluminum nitride or aluminum oxynitride material is deposited over and chemically bonded to the substrate body. An adherent, continuous, fully dense first outer layer about 0.5–900 microns thick including an oxide of aluminum or zirconium is deposited over and chemically bonded to the first intermediate layer. Each layer of the coating is a graded layer changing in composition from the material over which it is deposited to the material of that layer, and further to the material, if any, deposited thereon, so that no clearly defined compositional interfaces exist between the substrate and the layers, or between the layers.

A process according to the invention for depositing a high temperature stress and oxidation resistant coating on a silicon nitride- or silicon carbide-based substrate body involves passing over the substrate, at a temperature of about 900°–1500° C. and at a pressure between about 1 torr and about ambient pressure, a gaseous mixture comprising one or more halide vapors with other suitable reactant gases, and optionally a carrier gas. The gaseous mixture is passed over the substrate at partial pressure ratios, at flow rates, and for times sufficient to deposit a continuous, fully dense, adherent coating on the substrate. The halide vapors and other suitable reactant gases are gradually varied during the deposition of the coating in such a way that the coating is a graded coating including at least two adherent layers, each deposited as a graded layer changing in composition from the material over which it is deposited to the material of that layer and further to the material, if any, deposited thereon, so that no clearly defined compositional interfaces exist between the substrate and the layers, or between the layers. The vapors and gases and their partial pressures are varied according to a predetermined time schedule and the halide vapors and other suitable reactant gases are selected so that an article as described above is produced.

For a better understanding of the present invention, together with other objects, advantages, and capabilities thereof, reference is made to the following disclosure and appended claims.

DETAILED DESCRIPTION OF THE INVENTION

The article according to the present invention may be prepared by deposition of an adherent coating of two or more graded layers on a hard silicon-based ceramic substrate, for example, a monolithic or composite silicon nitride- or silicon carbide-based material or related material. The term "graded", as used herein, refers to a coating or layer of a coating in which the material gradually and continuously changes in composition from the material over which it is deposited to the material of the layer and further to the material, if any, deposited thereon, so that no clearly defined compositional interfaces exist between the substrate and the layers or coating, or between the layers. Although no clearly defined compositional interfaces exist,.lines that appear to be interfaces may or may not be visually discernible, since microstructural variations e.g. variations in grain size, may or may not occur within the coating. The deposition of a two or more graded layer coating which is adherent to the substrate under severe thermal cycling conditions, and is contact stress resistant, high temperature resistant, and resistant to chemical attack or breakdown at high temperatures depends on careful control of the process parameters. The outstanding properties of the coating are a result of the coating materials selected as well as of the gradual and continuous change in composition from the substrate to the outer surface of the coating.

The coating according to the invention includes at least two superimposed layers. Aluminum nitride or aluminum oxynitride is deposited over the substrate as an intermediate adherent layer and may serve as an oxygen diffusion barrier layer. Over the intermediate layer is deposited at least one outer oxide layer providing the protective and surface properties required for a heat engine component, for example, oxidation resistance, low oxygen permeability, and low coefficient of friction at room temperature and at elevated working temperatures. This coating is deposited over a silicon-based ceramic substrate, for example a monolithic or composite silicon nitride- or silicon carbide-based material such as reaction bonded silicon nitride (RBSN), sintered silicon nitride (SSN), sintered silicon carbide (SSC), hot isostatic pressed silicon nitride (HSN), or the composite silicon nitride materials disclosed in above-referenced U.S. Pat. Nos. 4,406,667, 4,409,004, 4,416,670, 4,421,525, and 4,441,894.

The aluminum nitride or aluminum oxynitride intermediate layer is about 0.5–20 microns, and preferably 2–10 microns thick, while the first outer layer, preferably an alumina-based composite layer, is 0.5–900 microns, preferably 0.5–20 microns, and most preferably 2–10 microns thick. The coating may include a second outer layer of an alumina-, zirconia-, or yttria-based composite material. An additional outer layer of a material selected to control the surface properties of the coated article may be deposited over the composite layer or layers. In each aspect of the invention, the outermost layer is about 0.5–900 microns thick, and is deposited over layers each of which is 0.5–20 microns, and preferably 2–10 microns thick.

The total thickness of the coating is at least partially dependent on such factors as the condition, e.g. the roughness, of the substrate, the number of layers, the required properties, etc. For thermal barrier coatings the preferred final thickness of the outermost layer is about 800–900 microns, resulting in a total. coating thickness which may be greater than 900 microns. Further, the final thickness of the outermost layer may be the result of post-deposition processing. For example, a thicker layer than ultimately desired may be deposited, and subsequent polishing or machining used to achieve the final surface characteristics and/or component dimensions.

Thermal expansion mismatch between the coating and the substrate or between the layers of the coating can lead to high tensile or compressive residual stresses at the interfaces between these various materials, as described above. Table I lists the thermal expansion coefficients of various materials contemplated for the substrates and coating layers of the article according to the invention, and shows the mismatches inherent in the materials listed.

TABLE I

| Layer | Material | Therm. Expn. Coeff., °C.$^{-1}$* |
|---|---|---|
| substrate | Si-based | 2–6 × 10$^{-6}$** |
|  | RBSN | 3.0 × 10$^{-6}$ |
|  | SSN | 3.0 × 10$^{-6}$ |
|  | SSC | 4.3–5.6 × 10$^{-6}$ |
| transition | Si$_w$Al$_x$O$_y$N$_z$ | ** |
|  | Sialon type | approx. 2.7 × 10$^{-6}$** |
| intermediate | AlN | 4.9 × 10$^{-6}$ |
|  | Al$_x$O$_y$N$_z$ | ** |
| outer | Al$_2$O$_3$ | 7.2–8.6 × 10$^{-6}$ |
|  | Al$_2$O$_3$/ZrO$_2$ | 5.2–8.6 × 10$^{-6}$** |
|  | Al$_2$O$_3$/Y$_2$O$_3$ | 5.2–8.6 × 10$^{-6}$** |
|  | ZrO$_2$ | 5.2–11.9 × 10$^{-6}$ |
|  | ZrO$_2$/Al$_2$O$_3$ | ** |
|  | Y$_2$O$_3$ | 4.5 × 10$^{-6}$ |
|  | Y$_2$O$_3$/Al$_2$O$_3$ | ** |

*from Engineering Property Data on Selected Ceramics, Vol. I (MCIC Report, March 1976) and Vol. III (MCIC Report, July 1981).
**range depends on composition.

The gradual change in composition through the thickness of the graded coating is achieved by control of the deposition process to produce regions of solid solutions of successively deposited component materials, in which a gradual change from one material to another occur. These graded regions, or transition zones, replace the clearly defined compositional interfaces exhibiting minimal diffusion between the materials deposited on the substrate. The graded regions or transition zones of solid solution are sufficiently broad to control shear stresses within the coating from thermal expansion-caused tensile and/or compressive forces, and to produce a coating exhibiting improved adherence. Such zones typically are between about 0.1 microns thick and substantially the entire thickness of the layer.

The process according to the invention for preparing the articles described above involves the use of a mixture of gases, including metal halides and other reactant gases, under carefully controlled conditions to deposit by chemical vapor deposition (CVD) compounds of the metals on the substrate. The deposition of a graded coating according to the invention is achieved by a continuous deposition process in which the reactant gases introduced to the process are changed gradually from the reactants required for one portion or layer of the coating to the reactants required for another portion.

The "nominal" materials of the aluminum nitride and/or aluminum oxynitride of the intermediate layer and the preferred alumina/zirconia composite or alumina outer layer, may be deposited using the following exemplary CVD reactions or reactions similar thereto:

$$AlCl_3(g) + NH_3(g) \rightarrow AlN(s) + 3HCl(g) \qquad (1)$$

$$2AlCl_3(g) + CO_2 + 3H_2 \rightarrow Al_2O_3(s) + 6HCl(g) \qquad (2)$$

$$2AlCl_3(g) + ZrCl_4(g) + 5CO_2 + 5H_2 \rightarrow (Al_2O_3 + ZrO_2) + 10HCl + 5CO \qquad (3)$$

An aluminum oxynitride layer, represented by the formula $Al_xO_yN_z$, indicating varying stoichiometry for the compound, may be deposited by carrying out reactions (1) and (2) simultaneously. The stoichiometry of the aluminum oxynitride deposited at any point will depend on the ratios of the reactant gases introduced to the deposition process with the $AlCl_3$.

Reaction (3) can, under carefully controlled conditions, result in codeposition of alumina and zirconia to form a composite two-phase oxide layer in which discrete particles of zirconia are distributed within a continuous alumina matrix. Other ratios of alumina to zirconia are possible using similar reactions. Similar reactions to reaction (3) also may be used to deposit a two phase, composite layer of $(xAl_2O_3 + yY_2O_3)$, $(xZrO_2 + yAl_2O_3)$, or $(xY_2O_3 + yAl_2O_3)$.

The deposition of a graded coating including a composite $Al_2O_3$ matrix/$ZrO_2$ particles or other two or more phase composite layer involves the codeposition, using for example reaction (3) or similar reaction, of two or more discrete oxide materials. Such codeposition also depends on careful control of the process parameters, for example partial pressures of the reactants, to control the relative deposition of the first and additional phase materials. The codeposition of these materials is described in further detail in above-referenced Applications 005,000 and 005,003.

The composite layers as described herein are two or more phase layers in which discontinuous discrete particles of alumina, zirconia or yttria, or a combination or solid solution of these are distributed in a continuous matrix of alumina, zirconia, or yttria, or a solid solution of these. The material or materials of the particles are different from that of the matrix.

Some examples of two or more phase composite layers according to the invention are: $Al_2O_3$ matrix/$ZrO_2$ particles, $Al_2O_3$ matrix/$Y_2O_3$ particles, $Al_2O_3$ matrix/$ZrO_2$ particles and $Y_2O_3$ particles, $ZrO_2$ matrix/$Al_2O_3$ particles, and $Y_2O_3$ matrix/$Al_2O_3$ particles.

The terms second phase, two-phase, and two or more phase as used herein refer to composites comprising a first phase continuous oxide matrix compound and one or more additional or second phases, which may be a single compound or more than one compound, in the form of discrete particles. The particles may be oxides of a single metal or a solid solution of oxides of more than one metal, and the individual particles maybe of the same or different compounds. The particles disclosed herein may be regularly shaped, as spheres, rods, whiskers, etc., or irregularly shaped.

One process for depositing the composite layer involves intermittently, during the deposition of the matrix material, e.g. alumina, pulsing into the gaseous mixture the gaseous reactants required to deposit the material or materials of the particles. Another process involves continuous flow codeposition of the materials of the matrix and particles, adjusting the component partial pressures to overcome differences in reactivity.

As may be seen from the above equilibrium reactions and discussion, the composition of the coating deposited at any point in the deposition process depends on the metal halides, if any, and other reactant gases introduced with the $AlCl_3$, and the relative flow rates of the gases. Likewise, a graded layer of $Y_2O_3$ or $ZrO_2$ may be deposited by gradually decreasing the partial pressure (or flow rate) of $AlCl_3$ in a mixture containing $YCl_3$ or $ZrCl_4$, until the $YCl_3$ or $ZrCl_4$ is the only metal halide in the gas mixture. Routine experimentation is used to determine the rate of deposition of the various materials of the coating at particular gas flow rates and temperatures. These values will determine the deposition time schedule and flow rate variations necessary to produce the desired coating configuration.

The CVD processes described above are the preferred deposition processes. However, the coatings according to the invention alternatively may be deposited by physical vapor deposition (PVD) methods such as plasma spraying and the like.

The following Examples are presented to enable those skilled in the art to more clearly understand and practice the present invention. These Examples should not be considered as a limitation upon the scope of the present invention, but merely as being illustrative and representative thereof.

EXAMPLE 1

Deposition of a graded aluminum nitride and aluminum oxide coating

Over a degassed monolithic SSN substrate body, such as a heat engine component, in a CVD reactor at 1350° C. is passed $AlCl_3$ gas in an inert carrier gas at a substantially constant flow rate. The pressure in the reactor is maintained at about 2-5 torr. Ammonia gas is mixed with the $AlCl_3$ at a flow rate sufficient to begin to deposit a continuous aluminum nitride layer on the silicon nitride substrate. After about a 4 micron layer of AlN is deposited, part of the flow of $NH_3$ is gradually, over a period of about 30 min., replaced by a flow of $CO_2$ at a flow rate relative to the flow of $AlCl_3$ to deposit by the reaction $$2NH_3(g) + 3CO_2(g) \rightarrow 3H_2O(g) + 3CO(g) + N_2(g) \quad (4)$$

and reactions (1) and (2) first a transition zone about 5 microns thick of a solid solution of AlN and $Al_2O_3$ ($Al_xN_yO_z$) gradually increasing from nearly completely AlN to nearly completely $Al_2O_3$, then the remainder of the outer layer, about 5 microns thick, of pure or nearly pure $Al_2O_3$.

EXAMPLE 2

Deposition of a graded coating comprising successive graded layers of $Si_wAl_xO_yN_z$, AlN, $Al_xO_yN_z$, $Al_2O_3/ZrO_2$ composite, $ZrO_2/Al_2O_3$ composite, and $ZrO_2$ Over a degassed sintered composite silicon nitride substrate including yttria and alumina sintering aids and reinforcing whiskers, in a CVD reactor at 975° C. and about 5-7 torr, is passed $AlCl_3$ and $NH_3$ gases in an inert carrier gas. The relative flow rates or partial pressures of the gases are selected to begin to deposit a continuous AlN layer on the substrate surface. After a time sufficient to deposit about a 3 micron layer of AlN, the flow of reactant gases is stopped and the reactor temperature is raised to 1350° C. with only inert gas flowing to aid diffusion of the substrate silicon and the oxygen from the oxide sintering aids into the AlN layer. After about 30 min, the flow of reactant gases is resumed, the temperature is lowered to 1050° C., and part of the $NH_3$ gas flow is gradually, over a period of about 1 hr. replaced by a flow of $CO_2$ at a flow rate relative to the flow of $AlCl_3$ to deposit over the AlN layer by reactions (4), (1), and (2) a graded zone about 5 microns thick of aluminum oxynitride gradually changing in stoichiometry from a composition very near AlN to a composition very near $Al_2O_3$, until the flow of gases contains no nitrogen. The flow of $AlCl_3$, $CO_2$, and $H_2$ in a carrier gas is controlled at partial pressure (flow rate) ratios selected to begin to deposit over the aluminum oxynitride zone, by a reaction similar to reaction (3), an $Al_2O_3$ matrix. $ZrCl_4$ is pulsed into the gaseous mixture for about 5 min out of every 15 min at a partial pressure selected to form discrete particles of $ZrO_2$ in the matrix. After a period of time sufficient to deposit a composite layer of $Al_2O_3$ matrix and $ZrO_2$ particles about 3 microns thick, the flow of $AlCl_3$ is gradually shut off and the flow of $ZrCl_4$ increased, while the flow of the other gases of the mixture is continued, for a time sufficient to gradually change the material deposited from an alumina-based composite gradually increasing in % zirconia, the total thickness of the alumina-based layer being about 8 microns, to a composite layer about 3 microns thick of a zirconia matrix containing a gradually decreasing percentage of discrete alumina particles, and finally to about a 1.5 micron $ZrO_2$ layer over the composite layers.

If desired, the adherence of the coatings according to the invention may be further improved by in-process heating (as in Example 2) or post-treatment of the coated article to further diffuse the materials into one another. Above about 1100° C., grading of the coating is aided somewhat by diffusion of components between the deposited materials or between the substrate and the material deposited thereon, the diffusion rate being temperature dependent. Below about 1100° C., grading of the coating is substantially dependent on the control of the deposition process, particularly as regards mixing of the reactant gases, as described above. Deposition at about 1100° C.–1500° C. may have special advantages in diffusing the components of the substrate into the aluminum nitride layer to produce, for example, a silicon aluminum nitride or a silicon aluminum oxynitride transition zone below the aluminum nitride material. Alternatively such graded transition zones may be deposited by a brief inclusion of the required components (e.g. an oxidizing gas) into the flow of reactants (e.g. AlN-depositing reactants).

As may be seen in Example 2, the deposition temperature need not be constant during the deposition of the graded coating according to the invention, but may be varied within the range of about 900°–1500° C. to control the deposition rates of the various components of the coating, as well as the diffusion rate during the process, as described above. The deposition temperatures used will also depend on the microstructure desired for the substrate and coating, and on any temperature sensitive components incorporated into the silicon-based material of the substrate.

The graded coatings according to the invention are fully dense, adherent, and make it possible to combine the advantageous properties of two or more components without the problems associated with differences in expansion coefficients and adhesion presented by superimposing continuous layers of the individual materials with clearly defined interfaces between the layers. The coatings are expected to find particular usefulness in high temperature applications such as advanced gas turbine engine components subject to contact stress, for example turbine rotors for such engines.

While there have been disclosed and described what are at present considered the preferred aspects of the invention, it will be obvious to those skilled in the art that various changes and modifications can be made therein without departing from the scope of the invention as defined in the appended claims.

I claim:

1. A process for depositing a high temperature stress and oxidation resistant coating on a silicon nitride- or silicon carbide-based substrate body comprising the steps of:

passing over the substrate, at a temperature of about 900–1500° C. and at a pressure between about 1 torr and about ambient pressure, a gaseous mixture comprising one or more halide vapors with other suitable reactant gases, and optionally a carrier gas, and at partial pressure ratios, at flow rates, and for times sufficient to deposit a continuous, fully dense, adherent coating; and gradually varying the composition of the gaseous mixture during the deposition of the coating in such a way that the coating is a graded coating comprising at least two adherent layers, each deposited as a graded layer changing in composition from the material over which it is deposited to the material of the layer and, in the case of all except the outermost layer, further to the material deposited thereon, so that no clearly defined compositional interfaces exist between the substrate and the layers, or between the layers;

wherein the step of gradually varying the composition of the gaseous mixture comprises varying partial pressures of the vapors and gases according to a predetermined time schedule and selecting the halide vapors and other suitable reactant gases so that the at least two layers comprise (a) an adherent, continuous intermediate layer about 0.5-20 microns thick of an aluminum nitride material, over and chemically bonded to the substrate body; and (b) an adherent, continuous first outer layer about 0.5-900 microns thick comprising an oxide of aluminum or zirconium over and chemically bonded to the intermediate layer.

2. A process according to claim 1 wherein the step of gradually varying the composition of the gases mixture includes selecting the predetermined time schedule and partial pressures of the vapors and gases so that the first outer layer comprises a graded composite ceramic material comprising a continuous layer of alumina or zirconia having dispersed therein discontinuous discrete particles of at least one material different therefrom and selected from the group consisting of alumina, zirconia, and yttria.

3. A process according to claim 1 wherein the step of gradually varying the composition of the gaseous mixture includes selecting the predetermined time schedule and partial pressure of the vapors and gases so that the first outer layer is 0.5-20 microns thick; and so that the at least two layers further comprise an adherent, continuous second outer layer about 0.5-900 microns thick, over and chemically bonded to the first outer layer, of a graded composite ceramic material different from that of the first outer layer and comprising a continuous layer of alumina, zirconia, or yttria having dispersed therein discontinuous discrete particles of at least one material different therefrom and selected from the group consisting of alumina, zirconia, and yttris.

4. A process according to claim 3 wherein the step of gradually varying the composition of the gaseous mixture includes selecting the predetermined time schedule and partial pressures of the vapors and gases so that the second outer layer is 0.5-20 microns thick; and so that the at least two layers further comprise an adherent, continuous additional outer layer about 0.5-900 microns thick, over and chemically bonded to the second outer layer, of alumina, zirconia, yttria stabilized zirconia, or yttria.

5. A process according to claim 1 wherein the step of gradually varying the composition of the gaseous mixture includes selecting the predetermined time schedule and partial pressures of the vapors and gases so that the first outer layer is 0.5-20 microns thick; and so that the at least two layers further comprise an adherent, continuous additional outer layer about 0.5-900 microns thick, over and chemically bonded to the first outer layer, of alumina, zirconia, yttria stabilized zirconia, or yttria.

6. A process for depositing a high temperature stress and oxidation resistant coating on a silicon nitride- or silicon carbide-based substrate body comprising the steps of:

passing over the substrate, at a temperature of about 900-1500° C. and at a pressure between about 1 torr and about ambient pressure, a gaseous mixture comprising one or more halide vapors with other suitable reactant gases, and optionally a carrier gas, and at partial pressure ratios, at flow rates, and for times sufficient to deposit a continuous, fully dense, adherent coating; and gradually varying the composition of the gaseous mixture during the deposition of the coating in such a way that the coating is a graded coating comprising at least two adherent layers, each deposited as a graded layer changing in composition from the material over which it is deposited to the material of the layer and, in the case of all except the outermost layer, further to the material deposited thereon, so that no clearly defined compositional interfaces exist between the substrate and the layers, or between the layers;

wherein the step of gradually varying the composition of the gaseous mixture comprises varying partial pressures of the vapors and gases according to a predetermined time schedule and selecting the halide vapors and other suitable reactant gases so that the at least two layers comprise (a) an adherent, continuous intermediate layer about 0.5-20 microns thick of an aluminum oxynitride material, over and chemically bonded to the substrate body; and (b) an adherent, continuous first outer layer about 0.5-900 microns thick comprising an oxide of aluminum or zirconium over and chemically bonded to the intermediate layer.

7. A process according to claim 6 wherein the step of gradually varying the composition of the gaseous mixture includes selecting the predetermined time schedule and partial pressure of the vapors and gases so that the first outer layer comprises a graded composite ceramic material comprising a continuous layer of alumina or zirconia having dispersed therein discontinuous discrete particles of at least one material different therefrom and selected from the group consisting of alumina, zirconia, and yttria.

8. A process according to claim 6 wherein the step of gradually varying the composition of the gaseous mixture includes selecting the predetermined time schedule and partial pressures of the vapors and gases so that the first outer layer is 0.5-20 microns thick; and so that the at least two layers further comprise an adherent, continuous second outer layer about 0.5-900 microns thick, over and chemically bonded to the first outer layer, of a graded composite ceramic material different from that of the first outer layer and comprising a continuous layer of alumina, zirconia, or yttria having dispersed therein discontinuous discrete particles of at least one material different therefrom and selected from the group consisting of alumina, zirconia, and yttria.

9. A process according to claim 8 wherein the step of gradually varying the composition of the gaseous mixture includes selecting the predetermined time schedule and partial pressures of the vapors and gases so that the second outer layer is 0.5-20 microns thick; and so that the at least two layers further comprise an adherent, continuous additional outer layer about 0.5-900 microns thick, over and chemically bonded to the second outer layer, of alumina, zirconia, yttria stabilized zirconia, or yttria.

10. A process according to claim 6 wherein the step of gradually varying the composition of the gaseous mixture includes selecting the predetermined time schedule and partial pressures of the vapors and gases so that the first outer layer is 0.5-20 microns thick, and so that the at least two layers further comprise an adherent, continuous additional outer layer about 0.5-900 microns thick, over and chemically bonded to the first outer layer, of alumina, zirconia, yttria stabilized zirconia, or yttria.

* * * * *